United States Patent
O'Brien et al.

(10) Patent No.: US 9,170,288 B2
(45) Date of Patent: Oct. 27, 2015

(54) DIELECTRIC ELASTOMER SELF-SENSING USING PLANE APPROXIMATION

(75) Inventors: Benjamin Marc O'Brien, Auckland (NZ); Todd Alan Gisby, Auckland (NZ); Iain Alexander Anderson, Auckland (NZ)

(73) Assignee: Auckland UniServices Limited, Auckland (NZ)

( * ) Notice: Subject to any disclaimer, the term of this patent is extended or adjusted under 35 U.S.C. 154(b) by 369 days.

(21) Appl. No.: 13/880,336

(22) PCT Filed: Oct. 18, 2011

(86) PCT No.: PCT/NZ2011/000214
§ 371 (c)(1),
(2), (4) Date: Jul. 18, 2013

(87) PCT Pub. No.: WO2012/053906
PCT Pub. Date: Apr. 26, 2012

(65) Prior Publication Data
US 2013/0285577 A1 Oct. 31, 2013

(30) Foreign Application Priority Data

Oct. 18, 2010 (NZ) .......................................... 588641
Apr. 7, 2011 (NZ) .......................................... 592131

(51) Int. Cl.
*H01L 41/04* (2006.01)
*G01R 27/26* (2006.01)

(52) U.S. Cl.
CPC .......... *G01R 27/2617* (2013.01); *H01L 41/042* (2013.01)

(58) Field of Classification Search
CPC .......................... G01R 27/2617; H01L 41/042
USPC .......... 318/116; 310/300, 308; 702/52, 54, 64, 702/65, 48
See application file for complete search history.

(56) References Cited

U.S. PATENT DOCUMENTS 4,786,837 A * 11/1988 Kalnin et al. .................. 310/364
6,809,462 B2 * 10/2004 Pelrine et al. .................. 310/319
(Continued)

FOREIGN PATENT DOCUMENTS

WO 2009/015151 A1 1/2009
WO 2010/095960 A1 8/2010

OTHER PUBLICATIONS

Chug, N., et al., "A Dielectric Elastomer Actuator With Self-Sensing Capability," Proc. of SPIE, Electroactive Polymer Actuators and Devices (EAPAD) vol. 6927: 69270V, Apr. 2008.
(Continued)

*Primary Examiner* — Rita Leykin
(74) *Attorney, Agent, or Firm* — Christensen O'Connor Johnson Kindness PLLC

(57) ABSTRACT

The present invention provides a method for obtaining feedback parameters related to the state of a dielectric elastomer (DE). The method comprises introducing a small-scale oscillation to the voltage difference between electrodes of the DE, monitoring or repeatedly measuring several measurable electrical characteristics of the DE, deriving other relevant data from the measurements, deriving an equation for a plane of best fit through the relevant data when defined as orthogonal axes, and deriving the feedback parameters from coefficients of the plane equation. The method thus provides important feedback regarding the capacitance, leakage current and/or electrode resistance of the DE. Also disclosed are a computer program and a system adapted to perform the method.

20 Claims, 9 Drawing Sheets

(56) References Cited

U.S. PATENT DOCUMENTS

| | | | |
|---|---|---|---|
| 6,882,086 | B2 | 4/2005 | Kornbluh |
| 6,969,941 | B1 | 11/2005 | Kapps |
| 7,394,182 | B2 * | 7/2008 | Pelrine et al. ............... 310/328 |
| 7,956,520 | B2 * | 6/2011 | Shankar et al. ........... 310/12.13 |
| 8,164,232 | B2 * | 4/2012 | Kornbluh et al. ............ 310/309 |
| 8,536,767 | B2 * | 9/2013 | Chen et al. .................. 310/365 |
| 8,860,336 | B2 * | 10/2014 | Anderson et al. ............ 318/116 |
| 2012/0086366 | A1 | 4/2012 | Anderson |

OTHER PUBLICATIONS

Chuc, N., et al., "Fabrication and Control of Rectilinear Artificial Muscle Actuator," IEEE/ASME Transactions on Mechatronics 16(1):167-176, Feb. 2011.

Gisby, T., et al., "An Adaptive Control Method for Dielectric Elastomer Devices," Proc. of SPIE, Electroactive Polymer Actuators and Devices (EAPAD) vol. 6927: 69271C, Apr. 2008.

Gisby, T., et al., "Integrated Sensing and Actuation of Muscle-Like Actuators," Proc. of SPIE, Electroactive Polymer Actuators and Devices (EAPAD) vol. 7287:728707, Apr. 2009.

Jung, K., et al., "A Self-Sensing Dielectric Elastomer Actuator," Sensors and Actuators A: Physical 143(2):343-351, May 2008.

Keplinger, C., et al., "Capacitive Extensometry for Transient Strain Analysis of Dielectric Elastomer Actuators," Applied Physics Letters 92(19):192903, May 2008.

O'Brien, B., et al., "Integrated Extension Sensor Based on Resistance and Voltage Measurement for a Dielectric Elastomer," Proc. of SPIE, Electroactive Polymer Actuators and Devices (EAPAD) vol. 6254: 625415, Apr. 2007.

Pelrine, R., et al., "Electrostriction of Polymer Dielectrics With Compliant Electrodes as a Means of Actuation," Sensors and Actuators A: Physical 64(1):77-85, Jan. 1998.

Toth, L., and Goldenberg, A., "Control System Design for a Dielectric Elastomer Actuator: the Sensory Subsystem," Proc. of SPIE, Electroactive Polymer Actuators and Devices (EAPAD) vol. 4695, Jul. 2002.

Gisby, T. A, et al., "Closed Loop Control of Dielectric Elastomer Actuators," Electroactive Polymer Actuators and Devices (EAPAD), Proc. of SPIE vol. 7976, 797620-797621, Mar. 2011.

International Search Report and Written Opinion mailed Jan. 17, 2012, issued in corresponding International Application No. PCT/NZ2011/000214, filed Oct. 18, 2011, 7 pages.

Extended European Search Report mailed Jun. 26, 2014, issued in corresponding European Application No. 11834687.3, filed May 16, 2013, 5 pages.

* cited by examiner

= 1 unit of mechanical energy

= 1 unit of electrical energy

DIELECTRIC ELASTOMER SELF-SENSING USING PLANE APPROXIMATION

FIELD

This invention relates to a method and apparatus for sensing electrical parameters of a dielectric elastomer (DE). More particularly, the invention relates to self-sensing by dynamically estimating the electrical parameters of the DE and deriving an estimate of the state of the DE from those parameters.

BACKGROUND

A dielectric elastomer (DE) can be used to convert electrical energy into mechanical energy, or vice versa. DEs can be used as actuators, generators, and/or sensors.

Referring to FIGS. 1(a) and 1(b), a DE (generally referenced 10) typically comprises a volumetrically incompressible dielectric elastomer membrane 11 provided between compliant electrodes 12.

Dielectric Elastomer Actuators (DEA) deform when a voltage difference is applied across the electrodes 12, as disclosed in "*Electrostriction of polymer dielectrics with compliant electrodes as a means of actuation*" (Pelrine R. E., Kornbluh R. D., & Joseph J. P., Sensors and Actuators, A: Physical 64(1), pp 77-85 (1998)), for example. Electrical charge accumulates on the electrodes 12 in the manner of a capacitor and an electrostatic pressure is generated that results in a through-thickness compression and in-plane expansion of the membrane, from the rest or contracted state as shown by example in FIG. 1(a), to the actuated or expanded state illustrated in FIG. 1(b).

If the planar dimensions of the DEA are much greater than its thickness, the magnitude of the pressure is defined by the equation below, where P is the pressure, $\epsilon_r$ is the relative permittivity of the dielectric material, $\epsilon_0$ is the permittivity of free space ($8.854 \times 10^{-12}$ F/m), V is the voltage, and d is the dielectric membrane thickness.

$$P = \epsilon_r \epsilon_0 \left(\frac{V}{d}\right)^2$$

A dielectric elastomer generator (DEG), on the other hand, converts mechanical energy into electrical energy. In effect, the DEG is a variable capacitor, and its capacitance changes with mechanical strain (i.e. deformation of the membrane).

The DEG generates electrical energy by increasing the electric potential energy stored in it. The steps to achieve this are illustrated diagrammatically in FIG. 2. Starting from the top of FIG. 2, mechanical energy 20 is initially applied to the DEG 21 by stretching it. This results in a planar expansion of electrodes 22 and an orthogonal compression of the membrane 23, leading to an increased capacitance. Electrical energy 24 is then input to the DEG by charging (or priming) from an electric power source (not shown) so that opposing electrodes 22 become oppositely charged. Relaxing the DEG will convert the mechanical energy into electrical energy by forcing apart the opposite charges (+ and −) on opposing electrodes 22, and forcing the like charges on each electrode 22 closer together due to the planar contraction thereof. The electrical energy 24 is extracted and the cycle repeats.

Dielectric elastomers may alternatively, or additionally, be used as a sensor. The electrical properties of dielectric elastomer sensors such as capacitance, electrode resistance, and the equivalent parallel resistance of the dielectric membrane change in response to external stimuli such as mechanical deformation or changes in the DE's operating environment, for example. Changes in the electrical parameters of the DE can therefore be used to acquire feedback information.

For many practical applications of DEAs, DEGs, and DE sensors, it is generally necessary or at least preferable to obtain feedback regarding the instantaneous state of the DEA for sensing and control purposes. For DEA and DEG, coupling them directly to discrete rigid strain, displacement, velocity or acceleration sensors inevitably increases the cost and mass of the device, and while such a strategy is effective for traditional, rigid devices that are part of kinematically constrained structures, it unnecessarily inhibits the motion of DEA/DEG. Similarly, attaching a sensor to a rigid body to which the DE is connected may provide useful feedback regarding the mechanical output, but provides limited information regarding the electromechanical state of the DE itself. The key therefore is to use the DE itself as a sensor, and combine sensing with actuation and/or generation, henceforth referred to as a "self-sensing" capability.

It is possible to relate a change in capacitance of the DE to changes in the physical geometry of the DE. Self-sensing efforts in the prior art have focused on combining sensing with actuation. "An adaptive control method for dielectric elastomer devices" (Todd A. Gisby, Emilio P. Callus, Shane Xie, and Iain A. Anderson, Proc. SPIE, 2008) discloses the use of self-sensing based upon the capacitance between electrodes to determine the state of a DEA, thereby providing some feedback. Similar methods are disclosed by "Control system design for a dielectric elastomer actuator: The sensory subsystem" (Toth, L. A. and A. A. Goldenberg, Proceedings of SPIE, 2002), "*Capacitive extensometry for transient strain analysis of dielectric elastomer actuators*" (Keplinger, C., Kaltenbrunner, M., Arnold, N., and Bauer, S., Applied Physics Letters, 2008) and "*A self-sensing dielectric elastomer actuator*" (Jung, K., K. J. Kim, and H. R. Choi, Sensors and Actuators A: Physical, 2008), for example.

International Patent Publication No. WO 2010/095960 entitled "System and Method for Dynamic Self-Sensing of Dielectric Elastomer Actuators" discloses an improved method and system for self-sensing by deriving an estimate of the capacitance of a DEA from the electrical potential difference across the capacitance of the DEA, the rate of change of that potential difference, and the current through the DEA. From the capacitance, estimates of the charge and physical state of the DEA can be derived. It is also possible to derive an estimate of the leakage current through the dielectric membrane.

However, this and other self-sensing methods of the prior art typically have one or more disadvantages. These may include the estimates being accurate only under certain circumstances, such as when the DE is stationary (i.e. not subject to any perturbations caused by external forces), the leakage current is negligible, or at low actuation speeds. Alternatively, or additionally, the methods and/or apparatus of the prior art obtain estimates based upon other assumptions which may not always hold true, are not suitable for practical implementation in a system designed for portable use, are sensitive to noise, and/or require unnecessarily complex, numerous, or processor-intensive calculations to be performed.

OBJECT OF THE INVENTION

It is an object of the invention to provide a method and apparatus for dielectric elastomer actuator or generator self-sensing or dielectric elastomer sensors which overcomes or at least ameliorates one or more disadvantages of the prior art, or alternatively to at least provide the public with a useful choice.

Further alternative objects of the invention will become apparent from the following description.

SUMMARY OF INVENTION

In one aspect the invention may broadly be said to consist in a method for estimating the state of a dielectric elastomer (DE), comprising the steps of:
- introducing a small-scale oscillation to the voltage difference between electrodes of the DE;
- measuring, over a period of time, potential difference across the DE and series current through the DE;
- deriving an equation for a plane of best fit through data derived from said measurements when defined as orthogonal axes; and
- deriving one or more feedback parameters from coefficients of the plane equation.

Preferably the feedback parameters comprise capacitance of the DE, wherein the capacitance is approximated by a first coefficient of the plane equation.

Preferably the first coefficient is the coefficient of a voltage variable of the plane equation.

Preferably the feedback parameters further comprise leakage current through the DE, wherein the leakage current is derived from a second coefficient of the plane equation.

Preferably the second coefficient is the coefficient of a time variable of the plane equation.

Preferably the period of time over which the potential difference across the DE and series current through the DE are measured is short relative to the mechanical and electrical time constants of the DE system.

Preferably said period of time is equal to, or greater than, a period of the small-scale oscillation.

Preferably the step of deriving an equation for the plane of best fit comprises performing regression analysis of the data derived from the measurements.

Preferably the step of deriving an equation for the plane of best fit comprises solving a set of linear equations.

Preferably the data derived from the measurements comprises potential difference across the DE, series current through the DE, charge supplied to the DE, and time, wherein the plane of best fit comprises a hyperplane.

Preferably the feedback parameters further comprise equivalent series resistance of the DE, wherein the equivalent series resistance is derived from a third coefficient of the hyperplane equation.

Preferably the third coefficient is the coefficient of a current variable of the hyperplane equation.

Preferably the equivalent series resistance is approximated by the third coefficient of the hyperplane equation, divided by the capacitance of the DE.

Preferably the leakage current is derived from the second coefficient of the plane equation by subtracting the nominal combined effects of the rate of change of capacitance of the DE and the rate of change of equivalent series resistance of the DE from the second coefficient.

Preferably the leakage current is derived using a time history of the capacitance and equivalent series resistance of the DE.

Preferably the approximation of the leakage current of the DE is derived using the approximations of capacitance and equivalent series resistance obtained according to the method of the present invention.

Preferably the first coefficient of the plane equation corresponds to a partial derivative of charge supplied to the DE with respect to the potential difference across the DE.

Preferably the second coefficient corresponds to a partial derivative of charge supplied to the DE with respect to time.

Preferably the third coefficient corresponds to a partial derivative of charge supplied to the DE with respect to the series current through the DE.

Alternatively, the data derived from the measurements comprises the potential difference across the capacitive component of the DE, charge supplied to the DE, and time.

Preferably said time, potential difference across the capacitive component of the DE, and charge supplied to the DE are defined as orthogonal x-, y-, and z-axes, respectively.

Preferable the leakage current is derived from the second coefficient of the plane equation by subtracting the product of the rate of change of the capacitance of the DE and the potential difference across the capacitive component of the DE from the second coefficient.

Preferably the rate of change of the capacitance of the DE is derived using a time history of the capacitance obtained according to the method of the present invention.

Preferably the method further comprises estimating the equivalent series resistance (ESR) of the DE by:
- supplying a Pulse Width Modulated (PWM) periodic actuation signal to the DE;
- measuring the magnitude of a step change in voltage across the DE and the step change in current through the DE at the transition of the PWM actuation signal; and
- dividing the step change in voltage across the DE by the step change in current through the DE.

Preferably estimating the ESR of the DE further comprises the steps of:
- recording the time-history of the estimated ESR; and
- deriving an approximation of ESR with respect to time from the recorded time-history of the estimated ESR, whereby the approximation can be used to estimate the ESR between transitions of the PWM actuating signal.

Preferably the potential difference across the DE is measured by determining the difference between the voltage at positive and negative terminals of the DE.

Preferably the charge supplied to the DE is derived by integrating the series current through the DE with respect to time.

Preferably the method further includes the step of relating the capacitance of the DE to the physical state of the DE. This may include estimates of one or more of the planar area, thickness, and/or dimensions of the DE, for example.

Preferably the method further includes the step of monitoring the leakage current and controlling inputs to the DE system to limit the leakage current.

Preferably the method further includes the step of relating the equivalent series resistance of the DE to the strain in the DE.

Preferably the method further comprises the step of controlling actuation of the DEA based upon the feedback parameters, thereby forming a closed-loop feedback control system.

In a further aspect, the invention may broadly be said to consist in a method of controlling a dielectric elastomer (DE), comprising the steps of:
- receiving an input signal indicative of a required state of the DE;
- obtaining an estimate of the state of the DE according to the method of any one of the preceding statements; and adjusting one or more system inputs in response to both the input signal and the estimate such that the estimated state substantially matches the required state.

In a further aspect, the invention may broadly be said to consist in a system adapted to perform the method of any one of the preceding statements.

In yet a further aspect, the invention may broadly be said to consist in a system comprising:

a dielectric elastomer (DE) comprising a pair of electrodes separated by an elastomer membrane;

power supply means adapted to supply a small-scale voltage oscillation to the DE;

measurement means for measuring the potential difference across the DE and series current through the DE; and computing means communicatively coupled to the measurement means, the computing means being adapted, over a predetermined period of time, to derive from the measurements data relating to the electrical characteristics of the DE, derive an equation for a plane which best fits the data, and derive one or more feedback parameters from coefficients of the plane equation.

Preferably the measurement means has a sampling frequency higher than a frequency of the predetermined period of time.

Preferably the computing means is further adapted to receive an input signal indicative of the required state of the DE, and to control one or more system inputs to provide closed-loop feedback control of the DE based upon the feedback parameters.

Preferably the computing means is adapted to perform regression analysis on the stored data and thereby derive an equation for a hyperplane which best fits the stored data when defined as orthogonal axes.

Preferably the feedback parameters comprise one or more of the capacitance, equivalent series resistance and/or leakage current of the DE.

Preferably the computing means is further adapted to record the feedback parameters.

Further aspects of the invention, which should be considered in all its novel aspects, will become apparent from the following description.

DRAWING DESCRIPTION

A number of embodiments of the invention will now be described by way of example with reference to the drawings in which.

DETAILED DESCRIPTION OF THE DRAWINGS

Figure 1:
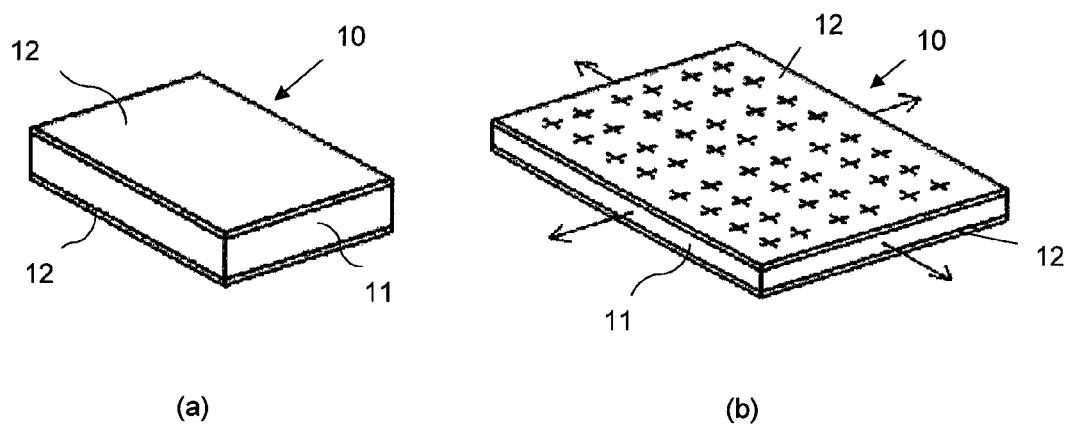
FIG. 1 is a diagram of a dielectric elastomer (DE) according to the prior art, shown in (a) rest; and (b) expanded states.
Figure 2:
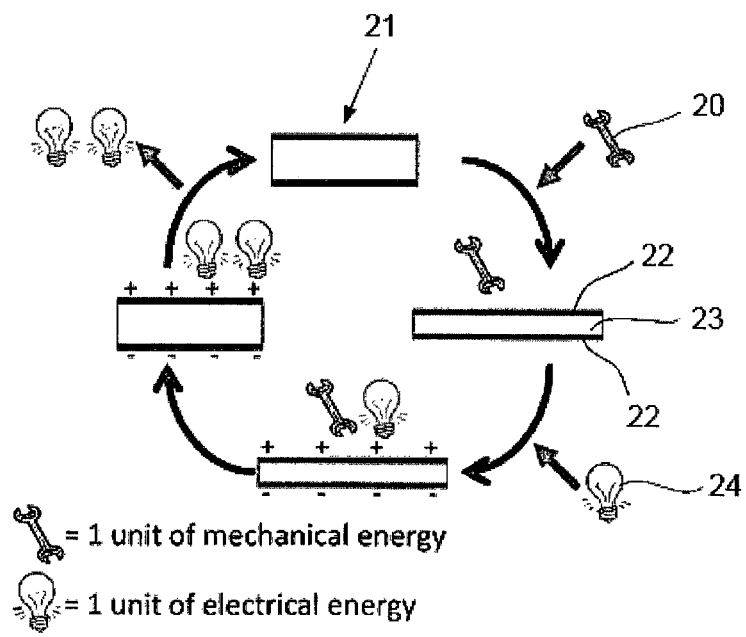
FIG. 2 is a process diagram illustrating the generation of electricity using a dielectric elastomer generator according to the prior art.

Capacitance, leakage current through the dielectric, membrane, and resistance of electrodes are each potentially important feedback parameters for a dielectric elastomer (DE), whether it is used as an actuator (DEA), a generator (DEG), or a sensor.

Capacitance can be related to the instantaneous area of the electrodes and the thickness of the dielectric membrane. It also allows the electric field within the dielectric to be evaluated, and is essential for measuring the electrical charge stored on the DE at any point of time. Leakage current is an indicator of the overall efficiency of the DE and can be used as part of a health monitoring system. The resistance of the electrodes (equivalent series resistance—ESR) changes as the DE deforms, thus the electrodes act in a manner akin to a strain gauge.

Knowledge of one or more of the above feedback parameters is therefore desirable for determining or estimating the state of the DEA. The "state" of the DEA may refer to size, shape, area, thickness, dimensions, deformation, electric field, electric charge, efficiency, and/or health of the DEA, for example.

Each of the above feedback parameters (capacitance, leakage current, and equivalent series resistance) is directly or indirectly influenced by the others and thus vary dynamically as the DE is subjected to electrical and mechanical stimuli. It is not uncommon for the relationship between strain and resistance to change over time and with the number of strain cycles, for example. Unfortunately, however, the parameters of interest cannot easily be measured directly.

According to the prior art, self-sensing has typically been limited to estimating the capacitance of the DEA and the Equivalent Series Resistance (ESR) of the electrodes. This self-sensing has generally been achieved by superimposing a high frequency, low amplitude AC signal on top of the actuation signal. The gain of the high frequency signal once it has passed through the DEA is proportional to capacitance, and the phase delay is related to the ESR. For portable devices however, low power DC-DC converters used to generate the actuation signal for a DEA typically have rectified outputs and have difficulty reproducing high frequency signals. Furthermore, such an approach prevents the power supply from being used to control multiple DEA independently; each degree of freedom would therefore require its own power supply. If actuation is intermittent, or if normal operation does not require all degrees of freedom be actuated simultaneously, dedicated power supplies are an inefficient use of volume and weight.

The present invention provides a method and apparatus which enables estimation of any or all of these key feedback parameters (capacitance, leakage current, and ESR) substantially in real-time, thereby reducing the need to make assumptions about their behaviour and improving the accuracy of feedback on the state of the DE for improved control and/or monitoring over a wide range of conditions.

First Example Embodiment

In a first embodiment of the invention described below by way of example, the method of the invention involves deriving data regarding four variables comprising three electrical characteristics of a dielectric elastomer (DE), and time. These four variables are defined as orthogonal axes forming an abstract four-dimensional space, and a plane of best fit through the data therefore comprises a three-dimensional hyperplane. The DE feedback parameters can be derived from coefficients of an equation for the hyperplane.

A hyperplane is an (n−1)-dimensional subspace of an n-dimensional space. It can be described in terms of the coordinate system of the n-dimensional space by a single linear equation. For example, in three-dimensional space, a two-dimensional plane with a characteristic equation of the form z=ax+by+c is a hyperplane (where x, y, and z are orthogonal axes in the three-dimensional space and a, b, and c are constants). The term 'hyperplane' as used throughout this description in describing the preferred embodiments of the invention refers to a three-dimensional subspace in a four-dimensional space. The characteristic equation of the 'hyperplane' is of the form z=ax+by+cw+d (where x, y, z, and w are orthogonal axes in four-dimensional space, and a, b, c, and d are constants).

Figure 3:
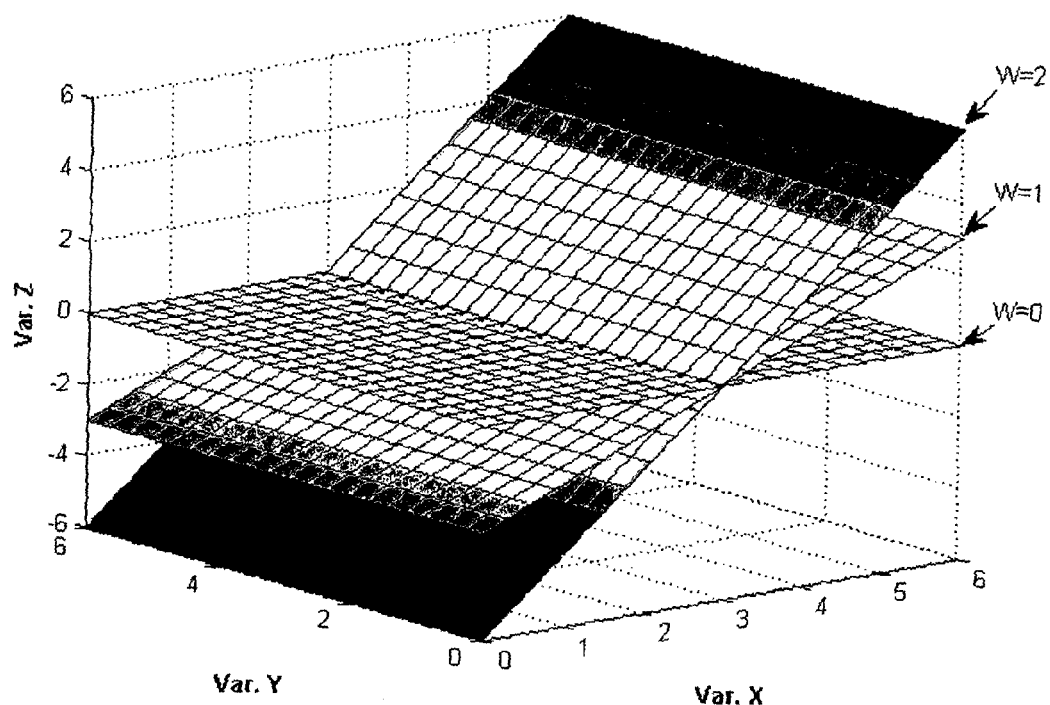
FIG. 3 is a three dimensional representation of a hyperplane in a four dimensional space.

Although a three-dimensional hyperplane in a four-dimensional space cannot be easily illustrated, FIG. 3 provides a three-dimensional representation of a hyperplane in a four dimensional space to illustrate the concept. The X, Y, and Z dimensions of the hyperplane are shown as orthogonal axes on a three dimensional plot, and the hyperplane has been discretized in the fourth dimension (W). This is analogous to representing a three dimensional surface (with X, Y, and Z as orthogonal axes) in two dimensions using a two dimensional contour plot in which, for example, X and Z are shown on orthogonal axes, and individual lines on the contour plot represent discrete values of Y.

Figure 4:
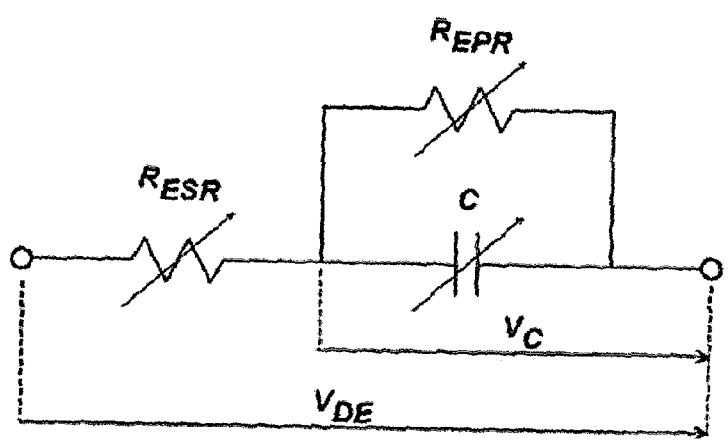
FIG. 4 is an electrical lumped circuit model of a DE.

An electrical lumped circuit model of a DE is shown in FIG. 4. The DE can be represented or modelled as a variable capacitor (C) in parallel with a variable resistance ($R_{EPR}$, representing the equivalent parallel resistance of the DE), both of which are together connected in series with another variable resistance ($R_{ESR}$, representing the equivalent series resistance of the DE).

Electrical characteristics of the DE which can be easily measured are the voltage $V_{DE}$ across the DE as a whole (i.e. between the terminals of the DE, as opposed to the potential difference between the electrodes 12, represented by the capacitor C), and the series current ($i_s$) through the DE.

The voltage across the capacitor ($V_c$) is the voltage across the DE ($V_{DE}$) minus the product of the series current ($i_s$) through the DE and the ESR of the electrodes ($R_{ESR}$), as shown by Equation 1.

$$V_c = V_{DE} - i_s R_{ESR} \quad (1)$$

The current through the DE ($i_s$) is equal to the sum of the current through the capacitive element ($i_c$) and leakage current through the EPR ($i_{EPR}$) (Equation 2).

$$i_s = i_c + i_{EPR} \quad (2)$$

The present invention derives estimates of the capacitance (C), leakage current ($i_{EPR}$; in the model of the DE, the current through the equivalent parallel resistance $R_{EPR}$), and equivalent series resistance ESR ($R_{ESR}$) by repeatedly measuring and deriving data from certain electrical characteristics of the DE, deriving an equation for a hyperplane of best fit through the data, and deriving feedback parameters of the DE from the coefficients of the hyperplane.

When a small scale, high frequency oscillatory signal is used to introduce oscillation in the voltage across the DE, a window of feedback data that spans a period of time greater than or equal to the period of the oscillatory component of the signal can be used to determine the DE feedback parameters. The present invention is not limited to any particular waveform for the oscillatory signal. Suitable waveforms include, but are not limited to, square waves, sine waves, triangle waves, or saw-tooth waves, for example.

The first step of the method is obtaining and recording measurements of the potential difference or voltage across the DE ($V_{DE}$), and series current ($i_S$) through the DE during a short time window. The time window should be short relative to the mechanical and electrical time constants of the DE. It is convenient to set the length of the window to correspond with the period of the small scale oscillation superimposed on the voltage across the DE.

Measurements of the voltage $V_{DE}$ and series current $i_s$ of the DE are taken at various times in the time period. From the latter measurement, the charge input to the DE ($Q_{input}$) over the time period can also be derived (i.e. as the integral of the series current $i_s$ over the time period) and recorded.

The measurements are preferably taken at a sampling rate substantially higher than the frequency of the time window, to give a plurality of data points during each time window.

It can be shown that the electrical charge input to the DE ($Q_{input}$) over a period of time which is short relative to the electrical and mechanical time constants of the DE is equal to the sum of the integral with respect to time of the current through the capacitive element of the DE between t=0 and t=$t_a$ (equivalent to $Q_c(t_a)$, the charge on the capacitor at t=$t_a$, minus $Q_c(0)$, the charge at t=0) and $Q_{leakage}(t_a)$, the integral with respect to time of the leakage current $i_{EPR}$ between time t=0 and t=$t_a$ (Equation 3).

$$Q_{input}(t_a) = Q_c(t_a) - Q_c(0) + Q_{leakage}(t_a) \quad (3)$$

Because of the short time period, C can be modeled using a first order approximation, i.e., it can be assumed that dC/dt is substantially constant. If the peak-to-peak amplitude of $V_c$ for the period of the window is sufficiently small, the leakage current ($i_{EPR}$, equivalent to $dQ_{leakage}/dt$) can also be assumed to be substantially constant. Applying these assumptions to Equation 3 and expressing the charge in terms of C and $V_c$ results in Equation 4.

$$Q_{input}(t_a) = C(t_a)V_c(t_a) - C(0)V_c(0) + \left(\frac{dQ_{leakage}}{dt}\right)t_a \quad (4)$$

The term $V_c$ in the first term on the right hand side of Equation 4 can be replaced by an equivalent term incorporating an ESR dependent term, i.e., $V_c$ becomes $V_{DE} - i_s R_{ESR}$, resulting in Equation 5.

$$Q_{input}(t_a) = \quad (5)$$
$$C(t_a)V_{DEA}(t_a) - C(t_a)i_s(t_a)R_{ESR}(t_a) - C(0)V_c(0) + \left(\frac{dQ_{leakage}}{dt}\right)t_a$$

Thus, instead of requiring the voltage across the capacitive component of the DE ($V_c$) the voltage across the DE itself ($V_{DE}$) can be used. $V_{DE}$ is an electrical characteristic of the circuit which can be easily measured, unlike $V_C$.

Equation 5 describes the relationship between the electrical parameters of the DEA at a point in time where t=$t_a$.

If t, $V_{DE}$, $i_s$, and $Q_{input}$ are defined as orthogonal axes of a 4D space, it has been found that the plurality of recorded data points, when plotted against those axes, all fall substantially on or adjacent a three-dimensional hyperplane. A large number of data points are preferably recorded to ensure that the plane fit is well conditioned. However, a relatively small number of data points (from a minimum of four) may be acceptable in certain applications. The appropriate number of data points (and thus the sampling rate of the measurements) for a particular application will be apparent to a skilled person.

An important part of successfully fitting a hyperplane to the available data points is the oscillations introduced in the voltage across the DE. Without the charge/discharge oscillations the $Q_{input}$, $V_c$, and t data would collapse into a line or 2D plane in the 4D space. The system would become underdetermined, and it would therefore be impossible to find a unique hyperplane that passed through all of the data points. This would cause the plane fitting process to fail and prevent the electrical characteristics of the DE from being accurately determined.

The coefficients of the hyperplane can be estimated and related to all three major feedback parameters of the DE. For example, regression can be used to find the coefficients of a hyperplane which best represents the recorded data points for t, $V_{DE}$, $i_s$, and $Q_{input}$ (i.e. a hyperplane of best fit). Other methods for estimating the coefficients of the hyperplane may alternatively be used without departing from the scope of the invention, however. The term "hyperplane of best fit" is used herein to refer merely to a hyperplane upon or substantially adjacent to which lie at least a majority of the data points in a 4D plot of potential difference, current, charge, and time, by whatever method that plane may be derived, provided that the gradient or slope of the plane along each axis corresponds substantially with the "slope" of the data points along that same axis.

The coefficients of the hyperplane formed by the recorded data points are equivalent to the partial derivatives of $Q_{input}$ (Equation 5) with respect to t, $i_s$, and $V_{DE}$. That is, the coefficients associated with each of the variables (t, $V_{DE}$, $i_s$, and $Q_{input}$) of the hyperplane equation represent the slope of the hyperplane along the respective axis. Given that the data points each fall substantially on a hyperplane, those slopes are equivalent to the aforementioned partial derivatives of Equation 5, and the feedback parameters of the DE can thus be derived from the hyperplane coefficients as follows.

Referring to Equation 5, it can be assumed that $dR_{ESR}/dt$ is constant, as well as dC/dt and $dQ_{leakage}/dt$ over the short time period or window of the relevant measurements. The term $C(0)V_c(0)$ is a constant, and thus does not appear in the partial derivatives.

The partial derivative of $Q_{input}$ with respect to $V_{DE}$ (equivalent to a first coefficient of the hyperplane equation) is the nominal capacitance of the DE over the period of the feedback window (C, Equation 6, time indices have been omitted for clarity); the partial derivative of $Q_{input}$ with respect to $i_s$ (equivalent to what is referred to as a third coefficient of the hyperplane equation), divided by C, is the nominal ESR of the electrodes for the period of the feedback window ($R_{ESR}$, Equation 7, time indices have been omitted for clarity); and the partial derivative of $Q_{input}$ with respect to t (equivalent to what is referred to as a second coefficient of the hyperplane equation) is the nominal combined effects of the rate of change of capacitance, the rate of change of the ESR of the electrodes, and leakage current (Equation 8, time indices have been omitted for clarity).

$$\frac{\partial Q_{input}}{\partial V_{DE}} = C \quad (6)$$

$$\frac{\left(\frac{\partial Q_{input}}{\partial i_s}\right)}{C} = -R_{ESR} \quad (7)$$

$$\frac{\partial Q_{input}}{\partial t} = \frac{\partial C}{\partial t}V_{DE} - \left(\frac{\partial C}{\partial t}R_{ESR} + C\frac{\partial R_{ESR}}{\partial t}\right)i_s + \frac{\partial Q_{leakage}}{\partial t} \quad (8)$$

An approximation or estimate of the capacitance C of the DE can thus be derived directly from the slope of the hyperplane of best fit along the voltage axis $V_{DE}$ (with respect to the $Q_{input}$ axis), i.e. the coefficient of the voltage variable in an equation defining the hyperplane of best fit.

Similarly, an approximation of the equivalent series resistance $R_{ESR}$ of the DE can be derived from the slope of the hyperplane along the series current $i_s$ axis (with respect to the $Q_{input}$ axis), divided by the capacitance C from the previous approximation.

A time history of C and $R_{ESR}$ calculated using Equations 6 and 7 can be used to calculate dC/dt and $dR_{ESR}/dt$ respectively (both assumed to be substantially constant), which can be used to identify the individual terms of Equation 8, and in particular the leakage current $i_{EPR}$ which is equivalent to the final term, $dQ_{leakage}/dt$.

This embodiment of the invention has several advantages over the second embodiment described below and/or the prior art, including one or more of the following:

1. The hyperplane fitting process is achieved using a single stage mathematical process;
2. There are less stringent requirements on the waveform used to generate the small scale oscillations in the voltage across the DE. That is, the method does not necessarily require a PWM power supply, thereby providing increased flexibility with regard to hardware design;
3. Capacitance is obtained directly from the fitting of the hyperplane to the available data; and
4. The process has low sensitivity to noise because:
    a. Integrating the series current (to obtain $Q_{input}$) acts as a means of low pass filtering the series current feedback data. Where noise has a mean value of zero, integrating acts to attenuate the noise component from the signal; and
    b. Using regression to fit a plane to the available data uses all of the data available. It does not rely on datum points from any one instant in time hence the influence of spurious data points on the estimated parameters is minimised.

Using a least squares regression process also provides a mechanism for evaluating the validity of the constant $dR_{ESR}/dt$, $dC/dt$ and $dQ_{leakage}/dt$ assumptions. Where the assumptions are valid, the residual of the regression process will be small. A large residual however indicates the one or more of the assumptions are not satisfied.

Second Example Embodiment

According to a second embodiment described below by way of a further example of the method of the present invention, the method involves deriving data regarding three variables comprising two electrical characteristics of a dielectric elastomer (DE), and time. These three variables are defined as orthogonal x-, y- and z-axes forming a three-dimensional space, and a plane of best fit through the data therefore comprises a plane.

This second example of the invention will be described below with respect to application of the method in relation to a dielectric elastomer actuator (DEA) system. However, the method may be similarly applied for a dielectric elastomer generator or sensor.

The DEA system uses Pulse Width Modulation (PWM) control of the input current (the actuation signal) to simultaneously actuate the DEA and introduce a small-scale oscillation to the voltage difference between the DE electrodes. This enables the capacitance of the DEA, leakage current through the equivalent parallel resistance (EPR) of the dielectric membrane, and the equivalent series-resistance (ESR) of the electrodes to be estimated dynamically, whilst the DEA is being actuated. PWM is readily compatible with digital computers, and enables a single power supply to be set to a fixed voltage and used to power multiple independent DEA simultaneously.

By making the period of the PWM signal sufficiently small with respect to the mechanical and electrical time constants of the DEA, controlling the duty cycle of the signal controls the average voltage seen across the DEA, which governs the degree of actuation. At the same time, the rapid switching of the PWM signal introduces small scale oscillations to this voltage. This method thus explicitly accounts for dynamic changes in the resistance of the electrodes, changes to the conductance of the dielectric membrane at high electric fields, and current induced due to the rate of change of the capacitance of the DEA as it is actuated and/or relaxed.

Although the method and apparatus/system of the second example embodiment is disclosed as comprising a PWM power supply, PWM is not an essential feature of the invention. Any other time varying signal may alternatively be used, such as an amplitude-modulated actuation signal with a high frequency oscillatory signal superimposed to permit sensing of capacitance and leakage current of the DEA. It is to be appreciated that the plane-fitting method of the invention may be used to enhance many existing or future methods of self-sensing, such as that disclosed by at least Keplinger et al., for example. However, a PWM power supply provides a number of advantages in at least this second example embodiment of the invention.

As in the first example embodiment previously described, it is necessary to measure the series current $i_s$ through the DEA and the voltage or electrical potential difference $V_{DEA}$ between the DEA's positive and negative terminals. Referring again to FIG. 4, the DEA can be modelled as a variable capacitor (C) connected in parallel with a variable resistance ($R_{EPR}$), both of which are connected in series with another variable resistance ($R_{ESR}$).

Figure 5:
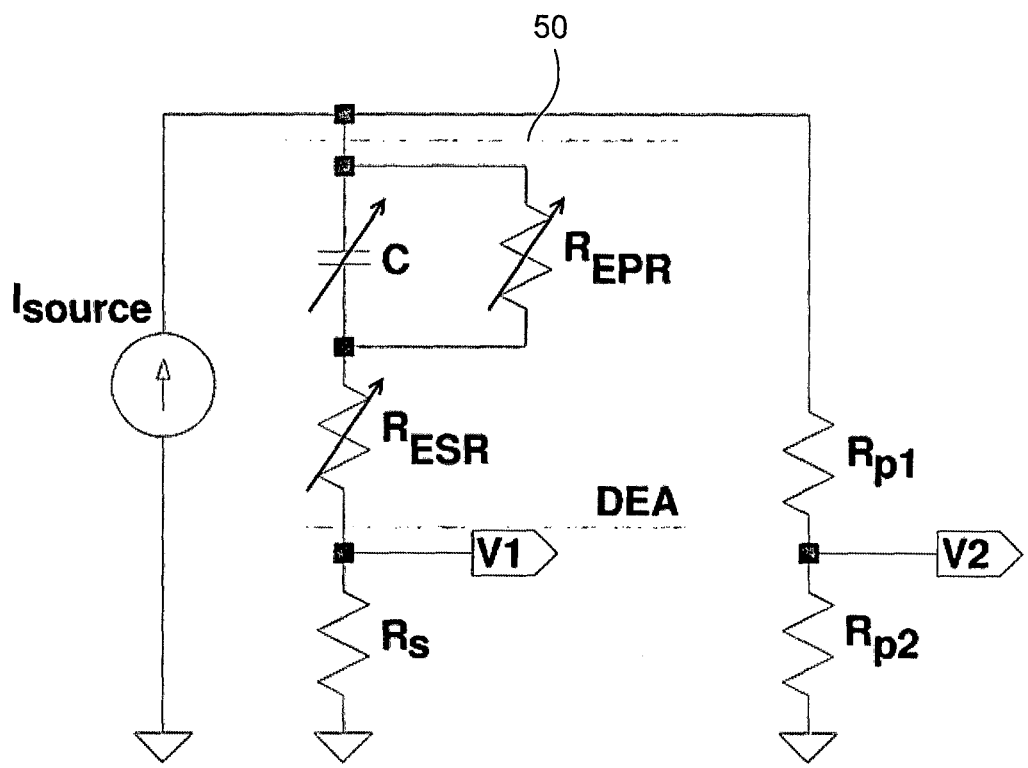
FIG. 5 is a schematic representation of a DEA as part of a simple self-sensing circuit according to the present invention

A schematic of the DEA system is shown in FIG. 5, with the DEA 50 represented by the components of the model of FIG. 4 inside the dashed box.

The power supply of the DEA system is preferably a high voltage DC-DC converter connected to the DEA via a high voltage, high speed opto-coupler. The current flowing from the DC-DC converter to the DEA via a PWM switch is proportional to the input current to the opto-coupler. Thus, together the DC-DC converter and opto-coupler behave as a current source ($i_{source}$). A PWM signal is used to control the input current to the opto-coupler. A 30 kΩ fixed resistor ($R_s$) is used to measure the series current through the DEA (by measuring the voltage V1 and applying Ohm's law), and a 100MΩ:120 kΩ ($R_{p1}$ and $R_{p2}$ respectively) resistor ladder (voltage divider) is used to measure the voltage V2 at the positive terminal of the DEA 50 and provide a passive discharge path for the DEA.

Unlike the first example of the invention described above, the method of this second example requires data regarding the potential difference across the capacitive component of the DEA ($V_c$), charge supplied to the DEA ($Q_{input}$) and time (t) to be derived from the measurements.

By plotting the charge supplied to the DE ($Q_{input}$), the voltage across the capacitive component of the DE ($V_C$), and time t on orthogonal axes, it is possible to reduce the hyperplane of the first example embodiment to a 2D plane fitted to data plotted in 3D space.

Where the ESR is significant, it is necessary to subtract the potential difference across the ESR ($V_{ESR}$) from the potential difference across the DEA ($V_{DEA}$) to determine the potential difference across the capacitive component of the DEA ($V_c$) as shown by Equation 9.

$$V_C = V_{DEA} - V_{ESR} \qquad (9)$$

For example, if the power delivered to the DE is controlled using Pulse Width Modulation (PWM), the equivalent series resistance $R_{ESR}$ can be estimated at the points in time where the PWM signal is transitioning between the high and the low states. The step change in the series current through the DE as the PWM signal transitions results in a step change in the voltage across the DE. Because the voltage $V_C$ across the capacitive component of the DE cannot change instantaneously, the $R_{ESR}$ is equal to the magnitude of the step change in the voltage $V_{DE}$ across the DE divided by the magnitude of the step change in the series current $i_S$ through the DE at the transition of the PWM signal. By recording the time-history of the calculated resistance values, an nth-order approximation of $R_{ESR}$ with respect to time can be used to estimate the electrode resistance at points in time between the PWM transitions.

Figure 6:
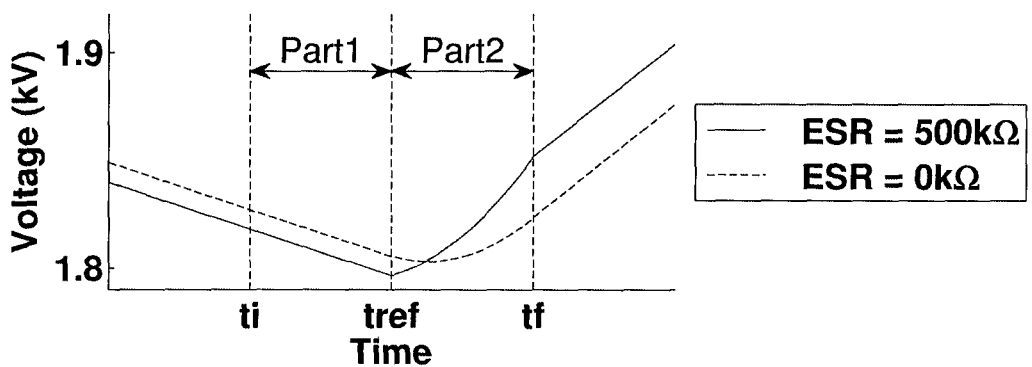
FIG. 6 illustrates the effect of the ESR upon the voltage across the DEA ($V_{DEA}$)

Other methods of sensing the ESR of the DEA may alternatively be used without departing from the scope of the invention. For example, if the slew rate of the PWM input signal is limited, the ESR can be sensed by considering two short time periods about the transition of the PWM signal (Part 1 and Part 2 in FIGS. 6 and 7). Part 1 begins just before the start of a cycle of the PWM input signal, and ends at the start of the PWM cycle. Part 2 continues from the end of Part 1, beginning at the start of the PWM cycle and ending once the PWM input signal reaches its peak value. The time at the beginning of Part 1 is the time at the end of Part 1/beginning of Part 2 is $t_{ref}$, and the time at the end of Part 2 is $t_f$. When the ESR is negligible, $V_{DEA} \approx V_c$ and $V_{DEA}$ exhibits a smooth transition from the discharging to the charging phase during Part 2, as shown in FIG. 6 (dashed line). All else being constant however, a significant ESR introduces a discontinuity or sharp corner to the voltage waveform at $t=t_{ref}$, as also shown in FIG. 6 (solid line). This discontinuity becomes more pronounced, i.e. the corner becomes sharper, as the ESR increases.

Figure 7:
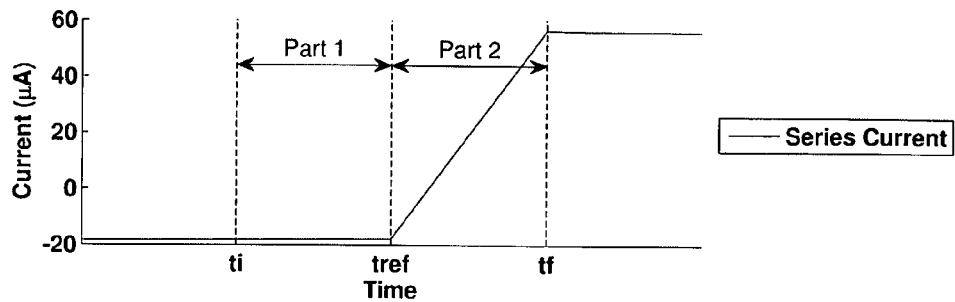
FIG. 7 illustrates the series current ($i_s$) through the DEA.

By assuming the ESR is constant for $t_1 < t < t_2$, the ESR can be estimated by transforming $V_{DEA}$ to eliminate the discontinuity. This requires four curve fit operations to be performed. By making the period of the PWM signal short relative to the electrical time constant of the system, the series current through the DEA ($i_s$) and potential differences across the DEA ($V_{DEA}$) during Part 1, and series current through the DEA ($i_s$) during Part 2 are approximately linear as illustrated in FIGS. 6 and 7 (Equations 10-12). Assuming that both $R_{EPR}$ and the derivative with respect to time of the capacitance are substantially constant about a specific point in time (a linearization point), applying a ramp input current (i.e. a limited slew-rate in the PWM input) results in $V_{DEA}$ describing a parabola along the time dimension. A second order fit is therefore required for $V_{DEA}$ during Part 2 (Equation 13).

$$i_{s(Part1)} = m_{i1}t + c_{i1} \quad (10)$$

$$V_{DEA(Part1)} = m_{v1}t + c_{v1} \quad (11)$$

$$i_{s(Part2)} = m_{i2}t + c_{i2} \quad (12)$$

$$V_{DEA(Part2)} = a_2 t^2 + a_1 t + a_0 \quad (13)$$

Substituting the fitted curves into Equation 9 (giving rise to Equations 14 and 15), the derivative with respect to time of $V_c$ for Part 1 must equal the derivative with respect to time of $V_c$ for Part 2 at $t=t_{ref}$ to eliminate the discontinuity. Thus, by equating the first derivatives with respect to time of $V_c$ for Parts 1 and 2 at $t=t_{ref}$, the equation for $R_{ESR}$ shown in Equation 16 can be derived.

$$V_{C(Part1)} = (m_{v1}t + c_{v1}) - (m_{i1}t + c_{i1})R_{ESR} \quad (14)$$

$$V_{C(Part2)} = (a_2 t^2 + a_1 t + a_0) - (m_{i2}t + c_{i2})R_{ESR} \quad (15)$$

$$R_{ESR} = \frac{m_{v1} - 2a_2 t_{ref} - a_1}{m_{i1} - m_{i2}} \quad (16)$$

A limited slew rate on the PWM signal provides a smooth transition from discharging to charging and vice versa. This eliminates switching noise, and ensures $V_c$ is a continuous function with respect to time, enabling $R_{ESR}$ to be estimated. The coefficients of Equation 13 that fit the raw data in a least squares sense can be found by solving simultaneous equations, which can be achieved in a straightforward manner using Cramer's rule, for example. This process is also convenient in a practical sense because many of the necessary sums can be pre-computed, and those that cannot can be updated as each data point becomes available.

Once the equivalent series resistance is known or estimated, by either of the above methods or any other alternative, the capacitance of the DEA can be calculated according to the method of this second example embodiment of the invention.

Referring to the sub-circuit in FIG. 5 representing the DEA 50, the voltage across the capacitor ($V_c$) is the voltage across the DEA 50 ($V_{DEA}$) minus the product of the series current ($i_s$) through the DEA and the ESR of the electrodes ($R_{ESR}$), as shown by Equation 17 (derived from Equation 9).

$$V_c = V_{DEA} - i_s R_{ESR} \quad (17)$$

The series current through the DEA sub-circuit ($i_s$) is equal to the sum of the current through the capacitive element ($i_c$) and leakage current through the EPR ($i_{EPR}$) (Equation 18).

$$i_s = i_c = i_{EPR} \quad (18)$$

When a small scale, high frequency oscillatory signal is superimposed on the actuation signal supplied to the DEA, a window of feedback data that spans one or more periods of the oscillatory component of the signal can be used to determine the capacitance of the DEA (C) and the leakage current ($i_{EPR}$). PWM has been used to generate the oscillatory component of the actuation signal, however if $V_c$ is known, other methods to generate periodic oscillations can be used to determine C and leakage current without departing from the scope of the invention.

It is convenient to set the width of the window of feedback data to correspond with the period of the PWM signal. We define the time (t) and the electrical charge stored on the DEA ($Q_c$) to be zero at the beginning of the window. As in the first example, the input charge $Q_{input}(t_a)$ to the DEA at time $t_a$ is defined by Equations 3 and 4.

The coefficients of the 2D plane formed by the t, $V_c$, and $Q_{input}$ data are equivalent to the partial derivatives with respect to t and $V_c$ of $Q_{input}$ in Equation 4. That is, the partial derivative with respect to $V_c$ of $Q_{input}$ (the first coefficient) is capacitance (C) (Equation 19, time indices have been omitted for clarity). The partial derivative with respect to time of $Q_{input}$ (the second coefficient) is the combined effect of the rate of change of the capacitance ($V_c \cdot \partial C/\partial t$), and the leakage current through the dielectric membrane ($\partial Q_{leakage}/\partial t$) (Equation 20, time indices have been omitted for clarity).

$$\frac{\partial Q_{input}}{\partial V_c} = C \quad (19)$$

$$\frac{\partial Q_{input}}{\partial t} = \frac{\partial C}{\partial t} V_c + \frac{\partial Q_{leakage}}{\partial t} \quad (20)$$

An approximation or estimate of the capacitance C of the DEA can thus be derived directly from the slope of the 2D hyperplane of best fit along the voltage axis (with respect to the $Q_{input}$ axis) i.e. the partial derivative of $Q_{input}$ with respect to $V_c$ (Equation 19).

Finite differences can be used to evaluate $\partial C/\partial t$ (i.e. approximating $\partial C/\partial t$ by determining the slope from two calculations of C over a short time period t), and this can be substituted into Equation 20 to separate the current $i_c$ induced due to the capacitance changing and the leakage current $i_{EPR}$ from the series current $i_s$ through the DEA. The leakage current $i_{EPR}$ (equivalent to the derivative with respect to time of the charge $Q_{leakage}$ leaking through the dielectric membrane) can thus be derived from the slope of the plane of best fit along the time axis, i.e., the second coefficient of the equation defining the plane of best fit (Equation 20).

The 2D plane that best fits the available data in the least squares sense can be found using regression, for example, although other methods may alternatively be used without departing from the scope of the invention, and the term "plane of best fit" is used in this context to refer merely to a 2D plane in a 3D space which is determined as defining a plane upon or substantially adjacent to which at least a majority of measured points in a plot of potential difference and charge with respect to time lie, by whatever method that plane may be derived, provided that the gradient or slope of the plane along both axes corresponds substantially with the slopes of the data points, as described below with respect to FIGS. 8-12.

The plane equation can be generalized to the form $f(x,y) = a_1 x + a_2 y + a_3$, where $t$, $V_c$ and $Q_{input}$ represent x, y, and $f(x,y)$, respectively. Thus, in the general case, the values for $a_1$, $a_2$, and $a_3$ that define the least squares solution can be found by solving the set of linear equations in Equation 21.

$$Ma = b \tag{21}$$

$$M = \begin{bmatrix} \sum_{j=1}^{n} t_j^2 & \sum_{j=1}^{n} t_j V_{cj} & \sum_{j=1}^{n} t_j \\ \sum_{j=1}^{n} t_j V_{cj} & \sum_{j=1}^{n} V_{cj}^2 & \sum_{j=1}^{n} V_{cj} \\ \sum_{j=1}^{n} t_j & \sum_{j=1}^{n} V_{cj} & \sum_{j=1}^{n} 1 \end{bmatrix}, a = \begin{bmatrix} a_1 \\ a_2 \\ a_3 \end{bmatrix},$$

$$b = \begin{bmatrix} \sum_{j=1}^{n} t_j Q_{input_j} \\ \sum_{j=1}^{n} V_{cj} Q_{input_j} \\ \sum_{j=1}^{n} Q_{input_j} \end{bmatrix}$$

For a set of three equations with three unknowns, this set of linear equations can be solved in a straightforward manner by applying Cramer's rule. Where $i = \{1,2,3\}$, the unknown variable $a_i$ can be found using Equation 22, where $M_i$ is the matrix formed by substituting the ith column of M with the column vector b.

$$a_i = \frac{\det(M_i)}{\det(M)} \tag{22}$$

As in the first example, the oscillations in the voltage across the DEA are important to avoid the $Q_{input}$, $V_c$, and t data collapsing substantially into a line in 3D space, whereupon an accurate plane of best fit cannot be found. With the oscillations two non-collinear lines of data are created, and therefore a unique plane can be fitted to the available data points.

To further describe this second embodiment of the invention, it is convenient to illustrate the influence of the electrical parameters of the DEA using 3D graphs. A numerical simulation of the simple driver circuit of FIG. 5 was created using the MATLAB software available from The Mathworks, Inc. to illustrate the influence of the electrical parameters of the DEA on the characteristic equation of the fitted plane.

Using the simulation, the time history of the voltages at the $V_1$ and $V_2$ nodes of the circuit were generated for a range of operating conditions. The voltage $V_{DEA}$ across and current $i_s$ through the DEA were recreated from this data. The voltage drop across the electrode resistance $R_{ESR}$ was then estimated and subtracted from the total voltage $V_{DEA}$ across the DEA to find the voltage $V_C$ across the capacitive component of the DEA. Time t, the voltage across the capacitor $V_C$, and the integral $Q_{input}$ of the series current $i_s$ were then plotted in a 3D space, and a 2D plane of best fit was overlaid on the data points. Regression using Cramer's Rule was used to estimate the equation for the fitted plane under various conditions.

Figure 8:
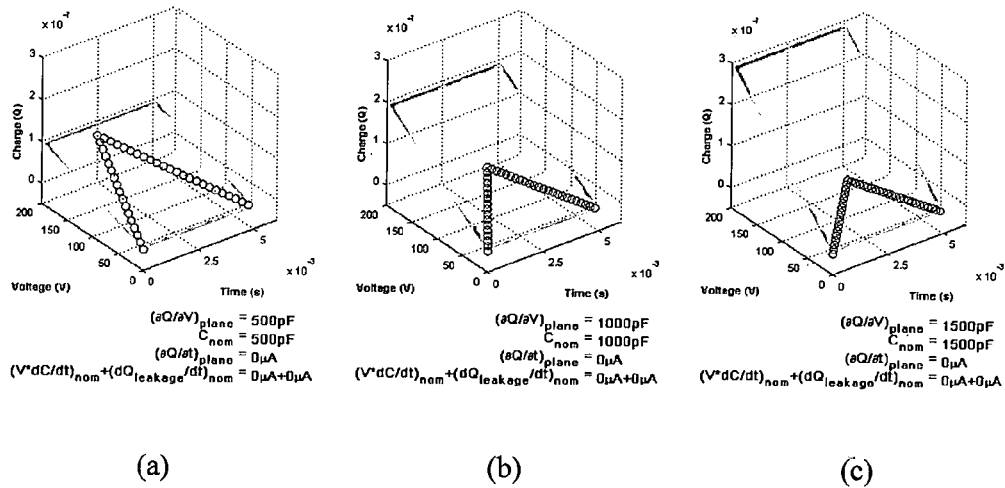
FIG. 8 illustrates the influence of capacitance on a fitted plane derived according to a second embodiment of the invention, with simulated capacitances of (a) 500 pF; (b) 1000 pF; and (c) 1500 pF.

FIG. 8 displays the influence of changes in capacitance on the fitted plane. Leakage current and dC/dt were set to zero, and capacitances of 500 pF, 1000 pF, and 1500 pF were simulated (FIG. 8 (a)-(c), respectively). Increasing capacitance serves to increase the slope of the fitted plane along the direction of the voltage axis. This is intuitive, since the larger the capacitance, the larger the change in the charge on the capacitor must be to achieve a given change in voltage. Below each graph are the results of the numerical simulation: $(\partial Q/\partial V)_{plane}$ is the slope of the fitted plane in the direction of the voltage axis, $C_{nom}$ is the actual nominal capacitance of the DEA over the 5 ms period shown; $(\partial Q/\partial t)_{plane}$ is the slope of the fitted plane in the direction of the time axis; $(VdC/dt)_{nom}$ is the product of the nominal voltage across the capacitive component of the DEA and the nominal rate of change of the capacitance of the DEA for the 5 ms period shown; and $(dQ_{leakage}/dt)_{nom}$ is the nominal leakage current for the 5 ms period shown.

Figure 9:
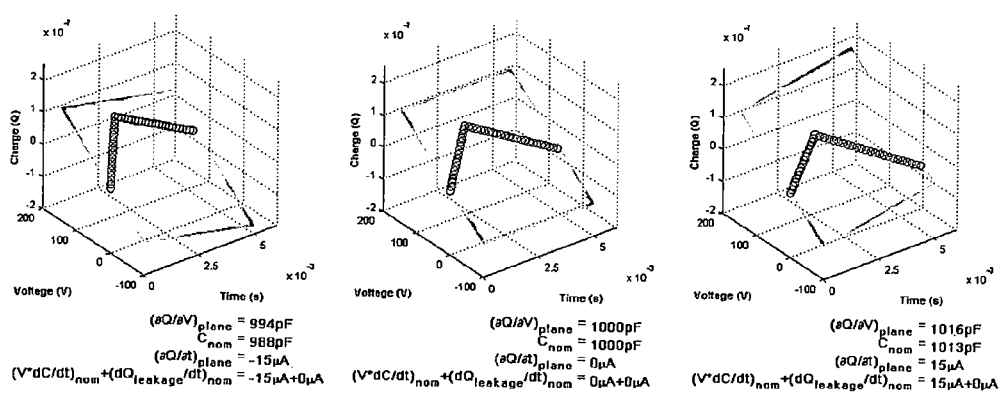
FIG. 9 illustrates the influence of a non-zero dC/dt on the fitted plane derived according to the second embodiment of the invention, with dC/dt values of (a) -500%/s; (b) 0%/s; and (c) 500%/s.

In FIG. 9, the effect of a non-zero dC/dt is shown. Leakage current $i_{EPR}$ was set to zero. The initial capacitance C was fixed at 1000 pF and the circuit was allowed to reach a steady state before a constant dC/dt was applied. The data plotted is from the first PWM cycle after the disturbance was applied. The values of dC/dt shown are (a) -500%/s; (b) 0%/s; and (c) 500%/s, respectively. Because leakage current is zero, any change in the total charge Q on the capacitor C along an equi-voltage line must be due to the change in the capacitance. That is, for the voltage across the capacitor to remain the same when the capacitance has changed, charge must flow on to or off of the capacitor. This therefore affects the slope of the fitted plane along the direction of the time axis. When the capacitance C is decreasing the slope decreases, and when it is increasing the slope increases. There small error between the capacitance as predicted by the slope of the fitted curve and the actual nominal value for the period shown is an artefact of the first order approximations made about C and $Q_{leakage}$. However, this error is less than 0.5% even at very high absolute values for dC/dt (±500%/s). Furthermore the nominal current induced due to the capacitance changing is still accurately estimated.

Figure 10:
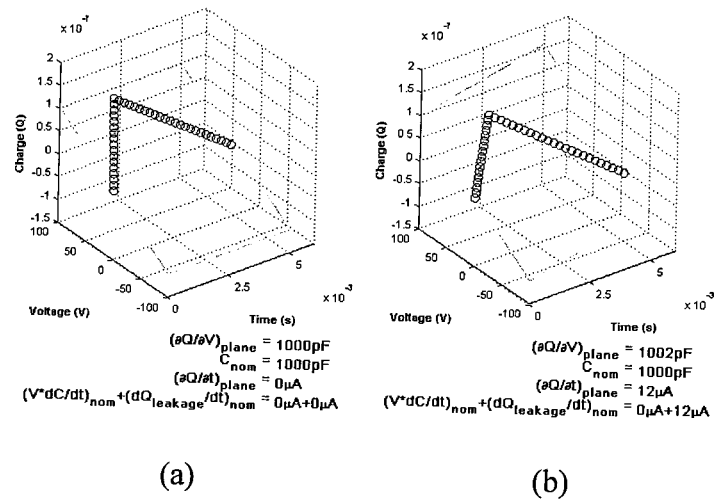
FIG. 10 illustrates the influence of leakage current on the fitted plane derived according to the second embodiment of the invention, with (a) a leakage current of zero (i.e. infinite EPR); and (b) an equivalent parallel resistance (EPR) of 250 MΩ.
Figure 11:
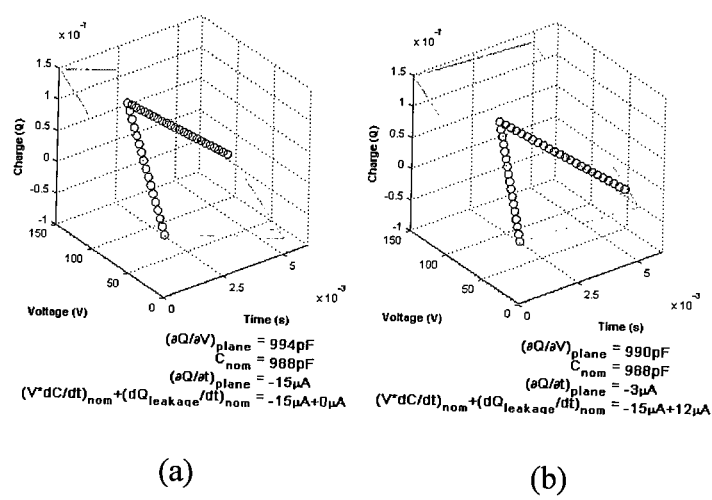
FIG. 11 illustrates the combined influence of leakage current and a negative value for dC/dt on the fitted plane derived according to the second embodiment of the invention, with (a) a negative value of dC/dt and a leakage current of zero; and (b) the same negative value of dC/dt, combined with an EPR of 250MΩ in parallel with the capacitance of the DEA.
Figure 12:
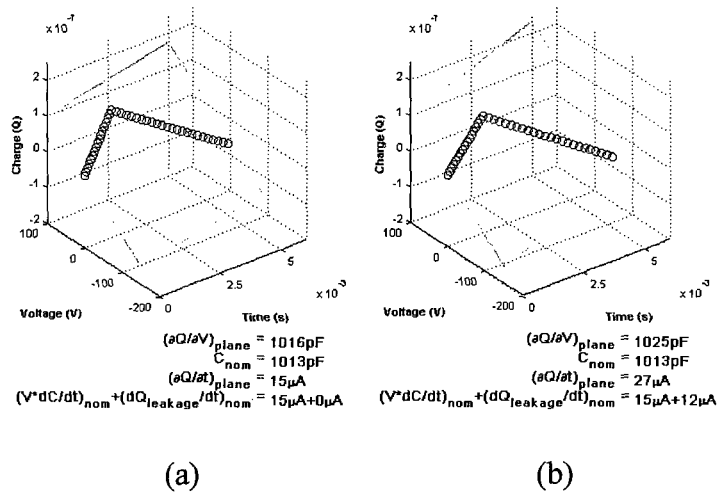
FIG. 12 illustrates the combined influence of leakage current and a positive value for dC/dt on the fitted plane derived according to the second embodiment of the invention, with (a) a positive value of dC/dt and a leakage current of zero; and (b) the same positive value of dC/dt, combined with an EPR of 250MΩ in parallel with the capacitance of the DEA.

In FIG. 10 the impact of leakage current $i_{EPR}$ is demonstrated. The initial capacitance C was fixed at 1000 pF and the circuit was allowed to reach a steady state before an EPR of 250MΩ was connected across the capacitor. Data for a circuit with (a) zero leakage current (i.e. infinite EPR); and (b) with the 250MΩ EPR are shown side by side as a comparison. Considering a line of equi-voltage, when the only disturbance to the system is leakage current, charge must continuously flow onto the capacitor for the capacitor voltage to remain constant. Again this is intuitive; a resistive path exists between the terminals of the DEA therefore a persistent current will flow through the DEA while a potential difference exists across its terminals. As indicated by Equation 20, leakage current also acts to change the slope of the fitted plane along the direction of the time axis. There is a small error between the estimated and actual nominal capacitance due to the linearization of the DEA, but again the leakage current is accurately estimated by the plane fitting process.

As illustrated in FIGS. 9 and 10 and explained above, leakage current $i_{EPR}$ and dC/dt both manifest as changes to the slope of the fitted plane along the direction of the time axis. In FIG. 11(b), the combined influence of leakage current and a negative value for dC/dt is shown next to a plot for the same value of dC/dt with no leakage current in FIG. 11(a) for comparison. FIG. 12(b) shows the combined influence of leakage current $i_{EPR}$ and a positive value for dC/dt is shown next to a plot for the same value of dC/dt and no leakage current in FIG. 12(a). Both phenomena manifest in the same manner on the plane of best fit. However, because capacitance C can be calculated from the slope of the plane along the direction of the voltage axis, dC/dt can be estimated using a time history of C and finite differences. This can therefore be used to separate the effects of leakage current and the capacitance changing. The error in the estimated capacitance increases slightly under the combined influence of both a high value for dC/dt and leakage current, but it is still small and the slope of the fitted plane in the direction of the time axis still accurately estimates the combined influence of the currents induced due to the capacitance changing and leakage current.

The results of experimental validation of the above method are also shown in the Figures to further illustrate the invention. Several test DEA circuits were constructed using nominally fixed value components to validate the ESR and leakage current estimation aspects of the self-sensing system. The circuits consisted of a high voltage capacitor and a range of resistors representing the ESR and EPR of the DEA. This enabled the circuit to be broken down into its constituent parts so that they could easily be tested independently. The unknown voltage dependence of the high voltage ceramic capacitance precluded its use in validating the capacitance estimation. Instead an expanding dot DEA was used to evaluate the performance of the capacitive sensing. The estimated capacitance was compared with the expected capacitance based on the change in area of the electrodes as measured using video feedback.

Figure 13:
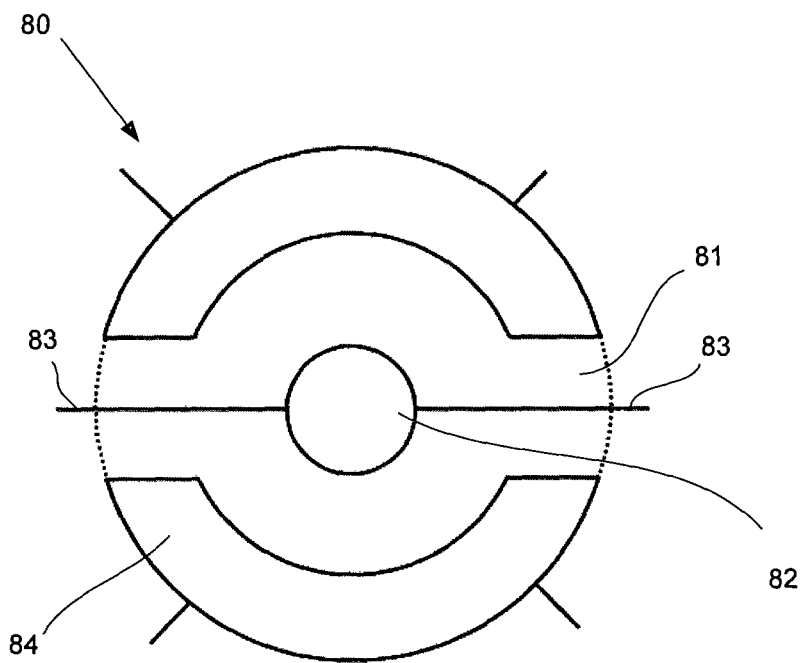
FIG. 13 illustrates diagrammatically an expanding dot DEA used to experimentally validate the second embodiment of the method of the present invention.

The expanding dot DEA, illustrated diagrammatically in FIG. 13 (not to scale) and generally indicated 80, was constructed from VHB4905, a common DEA membrane material available from 3M Company, pre-stretched to 16 times its original area and bonded to a rigid support frame 81. The frame had a circular internal aperture with a diameter of 130 mm. In the centre of the stretched membrane a circular electrode 82 of diameter 50 mm was applied to opposing sides of the membrane using Nyogel 756 electrically conductive carbon loaded grease, available from Nye Lubricants, Inc. Nyogel 756 conducting tracks 83 were also applied radially out from the electrode area to the points on the edge of the support frame that could be connected to external circuitry.

Upon application of an activation voltage, the area of the electrodes 82 expanded radially. A second independent DEA 84 was patterned around the perimeter of the VHB membrane for the purpose of applying a disturbance. Activation of the second DEA relaxed the radial tension in the membrane around the perimeter of the expanding dot, causing it to contract until a new equilibrium between the electrostatic and mechanical forces was found.

Every combination of four values for the ESR (no resistance, 225 kΩ, 447 kΩ, and 675 kΩ) and three values for the EPR (no resistance, 300MΩ, and 150MΩ) were tested to evaluate the ESR and leakage current estimation capabilities of the system. Each test circuit was subjected to duty cycles corresponding to average voltages of 500-2500V in 500V steps.

The expanding dot DEA was used to evaluate the estimation of capacitance. To measure its rest capacitance ($C_0$), a 10MΩ resistor was connected between the negative terminal of the DEA and ground, and a low voltage triangle wave (20V peak-to-peak at 0.8 Hz) was applied to the positive terminal of the DEA. Capacitance was calculated using the ratio of the amplitude of the current through the 10MΩ resistor to the rate of change of the input voltage (Equation 23). A camera was used to measure the area of the electrodes when no voltage was applied to the DEA. This measurement served as the reference area that enabled the area stretch (λ) of the DEA to be estimated, which is related to the instantaneous capacitance by Equation 24.

$$C = \frac{i}{\left(\frac{dV}{dt}\right)} \qquad (23)$$

$$C = C_0 \lambda^2 \qquad (24)$$

For high voltage testing, the DEA was connected to the self-sensing circuit of FIG. 5. The current source was configured to supply 95 μA when the opto-coupler was switched on and substantially 0 μA when switched off. A 200 Hz PWM signal was used to control the input current to the opto-coupler. The DEA was initially subjected to a PWM duty cycle of 10% until a steady state was reached. This was then increased by 1% every 10 seconds. A sinusoidal disturbance signal (0-2000V at 0.1 Hz) was simultaneously applied to the second DEA patterned around the perimeter of the stretched membrane. The experiment was complete after the DEA had spent 10 seconds at a duty cycle of 30%. The area stretch of the electrodes was measured using video extensometry and used to estimate the capacitance. This was compared to the capacitance as estimated using the self-sensing process.

Figure 14:
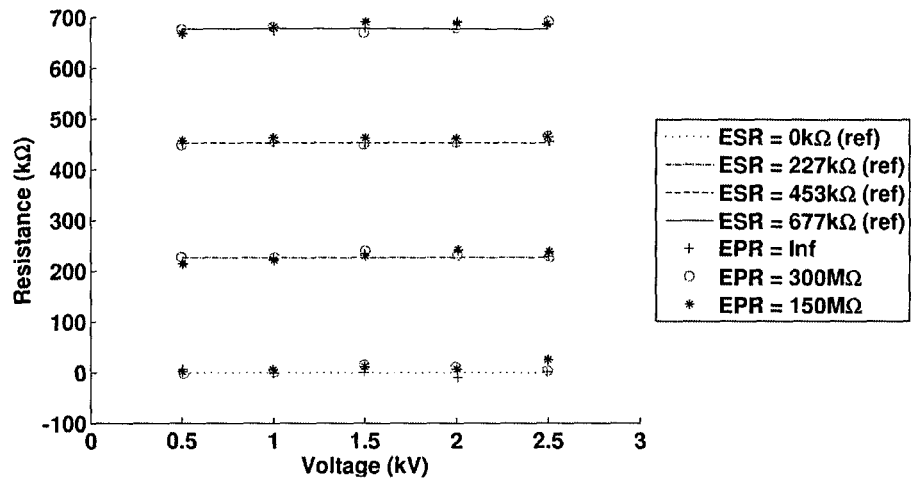
FIG. 14 shows a graph of estimated and actual equivalent series resistance (ESR) versus voltage for a range of values of ESR and EPR, wherein the estimated values are derived according to the second embodiment of the invention.

FIG. 14 shows the experimental validation of the ESR estimation. The lines indicate the true values of the ESR, and the data points indicate the estimated value for the ESR. There are three sets of data for each value of the ESR: one for each of three values for the EPR.

The test DEA circuits used to evaluate the ESR and leakage current estimation capabilities of the self-sensing method used a ceramic capacitor with an unknown voltage dependent capacitance. Despite this, accurate estimates of both the ESR and leakage current were achieved. As shown by FIG. 14, estimations for the ESR exhibited negligible voltage dependence for a range of voltages representative of those likely to be applied to a DEA. Furthermore, the estimated ESR exhibited no notable dependence on the magnitude of the leakage current.

Figure 15:
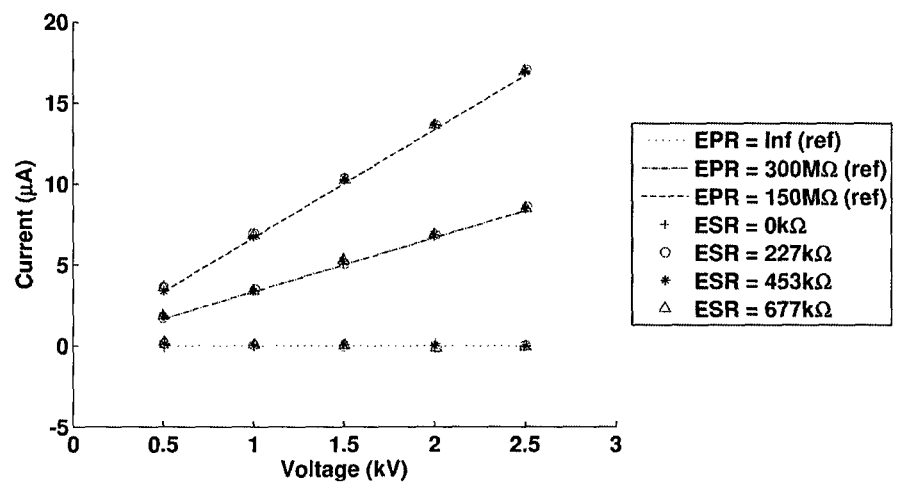
FIG. 15 shows a graph of leakage current, estimated using the second embodiment of the invention, versus voltage for a range of values of ESR and EPR.

FIG. 15 shows the experimental validation of the leakage current estimation. The lines indicate the predicted leakage current based on the voltage across the capacitive element of the test DEA circuit and the value of the EPR connected in parallel. The data points indicate the estimated value for the leakage current. There are four sets of data for each value of the EPR: one for each of four values for the ESR.

From FIG. 15, it can be seen that the leakage current was accurately estimated for a range of values of $R_{EPR}$ over a range of applied voltages. Furthermore, the ESR had negligible influence on the accuracy of the estimation of leakage current. This reinforces the accuracy of the estimation of the ESR; estimation of leakage current requires an accurate estimation of the voltage across the $R_{ESR}$.

Figure 16:
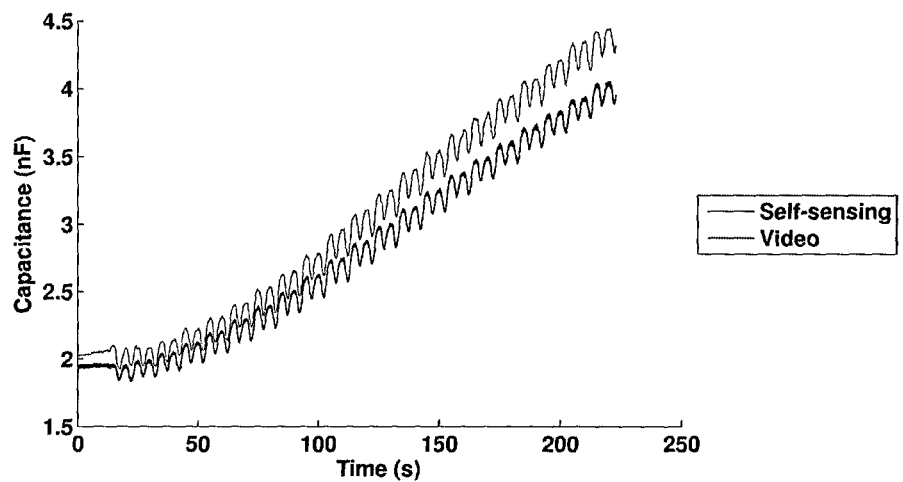
FIG. 16 shows a comparison of the capacitance of the test DEA as estimated by the second example embodiment of the self-sensing method of the present invention, with respect to capacitance measured by video extensometry.
Figure 17:
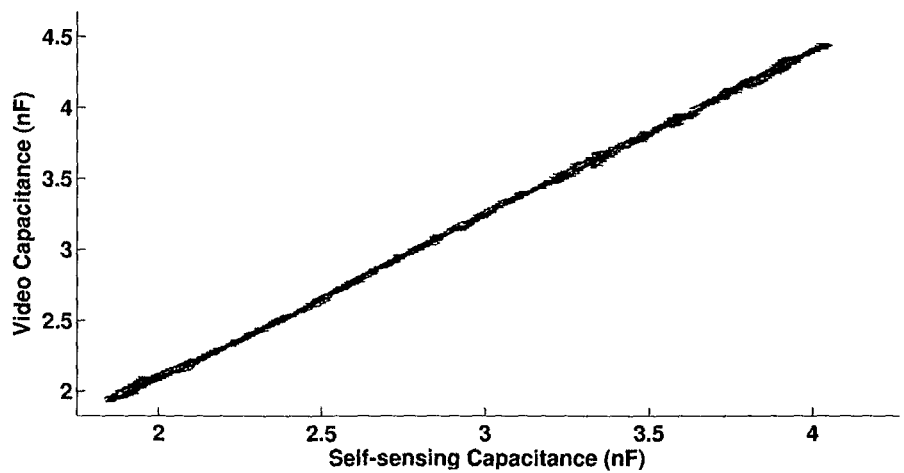
FIG. 17 shows the capacitance of the DEA as estimated by the second embodiment of the self-sensing method plotted against the capacitance as estimated by video extensometry.
Figure 18:
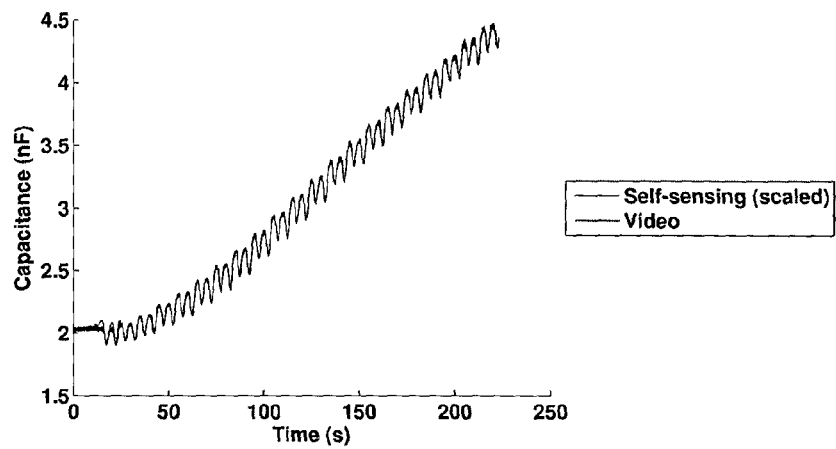
FIG. 18 shows the capacitance of the DEA as estimated by the second embodiment of the self-sensing method plotted against the capacitance as measured by video extensometry, after the estimated capacitance of the DEA has been scaled according to the relationship shown in FIG. 17.

FIG. 16 shows that there is excellent agreement between the shapes of the capacitance as estimated by the self-sensing process versus the capacitance as measured. There is a small proportional offset (or gain error) between the two capacitances, however FIG. 17 shows that there is a linear relationship between the estimate and measurement i.e. a simple calibration routine merges the two lines, as shown in FIG. 18. This is particularly significant because this linear relationship is achieved even when the DEA is subjected to an external disturbance, thus the offset observed is not an artefact of the inherent behaviour of the self-sensing circuit.

Practical Applications of the Methods

The present invention thus provides accurate feedback on any one or more of three key feedback parameters of a DE, which in turn provide improved feedback on the state of the DE.

Leakage current can at the very least provide a measure as to the efficiency of the DE, and may provide a mechanism for predicting and preventing dielectric breakdown (a major failure mode of the DE). High localized leakage current is invariably the ultimate cause of irreversible damage to the DEA when it undergoes dielectric breakdown.

Given that the electrical parameters of a DE can change significantly when it is deformed, it will be appreciated that the present invention is also particularly useful for characterising the properties of a DE-based device in situ, i.e., feedback regarding the state of the DE can be provided while it is performing the task it was designed to do, whether as an actuator, generator, or simply a sensor.

For common DE membrane materials that are volumetrically incompressible within the typical operating range of a DE and where the dielectric constant does not change significantly with the degree of actuation or the strain state of the DE, capacitance is an excellent predictor of the area of the electrodes, thus providing a basis for a closed-loop feedback system enabling improved control of actuation or generation.

Given the relationship between capacitance of a DE and the area of the electrodes thereof, it will be appreciated that the present invention is particularly useful in providing feedback on the actuation of a dielectric elastomer actuator (DEA), and in particular may be utilised in forming a closed-loop feedback system using self-sensing to allow improved control of the DEA. Implementation of such a system, typically involving some form of computing means or computing device such as a microcontroller, FPGA, or programmable logic controller (PLC), and a control algorithm such as proportional-integral-derivative (PID) control for example, is considered to be within the capabilities of a skilled person with experience in the field of embedded and control systems, and is therefore not described in detail herein.

Estimating the capacitance of the DE also enables estimation of the instantaneous electrical charge stored on the DE. Controlling the charge (as opposed to voltage) of a DE can greatly improve the overall stability of the DE. Rearranging Expressing the pressure P as a function of Q gives Equation 25, where Q is the electrical charge on the DE, d is the thickness of the dielectric membrane, and volume is the product of the area of the electrodes and the thickness d of the dielectric membrane.

$$P = \frac{1}{\varepsilon_r \varepsilon_0}\left(\frac{Qd}{\text{volume}}\right)^2 \quad (25)$$

If a constant charge Q is maintained on the DE electrodes, and the thickness of the dielectric membrane remains substantially uniform, a mechanical disturbance that acts to reduce d will also reduce the electrostatic pressure, and vice versa. The electrostatic pressure thus acts to reject the disturbance and thereby prevents the DE from undergoing electromechanical instability. In contrast, when a constant voltage is maintained the electrostatic pressure will act to sustain any mechanical disturbance. Most importantly, however, being capable of controlling both charge and voltage makes it possible to control the effective stiffness of the DE.

Controlling the stiffness of the DE creates a number of potential opportunities particularly for DEA-based artificial muscle powered devices. Compliant actuators are backdrivable. They have the inherent ability to absorb mechanical shocks and dampen vibrations and mechanical disturbances. In robotic manipulators the grip strength can be controlled, and compliant grippers naturally adapt to the form of the object being gripped, making them well suited to the task of manipulating irregular shaped or soft objects, or objects that may shift relative to the manipulator as they are translated through space. For walking robots, compliant joints prevent the feet from bouncing upon landing and ensure good contact is maintained between the robot's feet and the ground, particularly where the ground is uneven, which improves the stability of the robot. Furthermore, controlling the compliance of the leg joints and letting momentum and kinetic energy govern the trajectory of each segment of the leg as opposed to maintaining close control of all of the joint angles using high gain position control offers significant savings in terms of the input energy required.

In a broad sense, therefore, the method of the present invention relates to obtaining measurement signals indicative of electrical characteristics of a DE, and transformation of those measurements to derive a signal or data representative of the physical state and/or feedback parameters of the DE.

Figure 19:
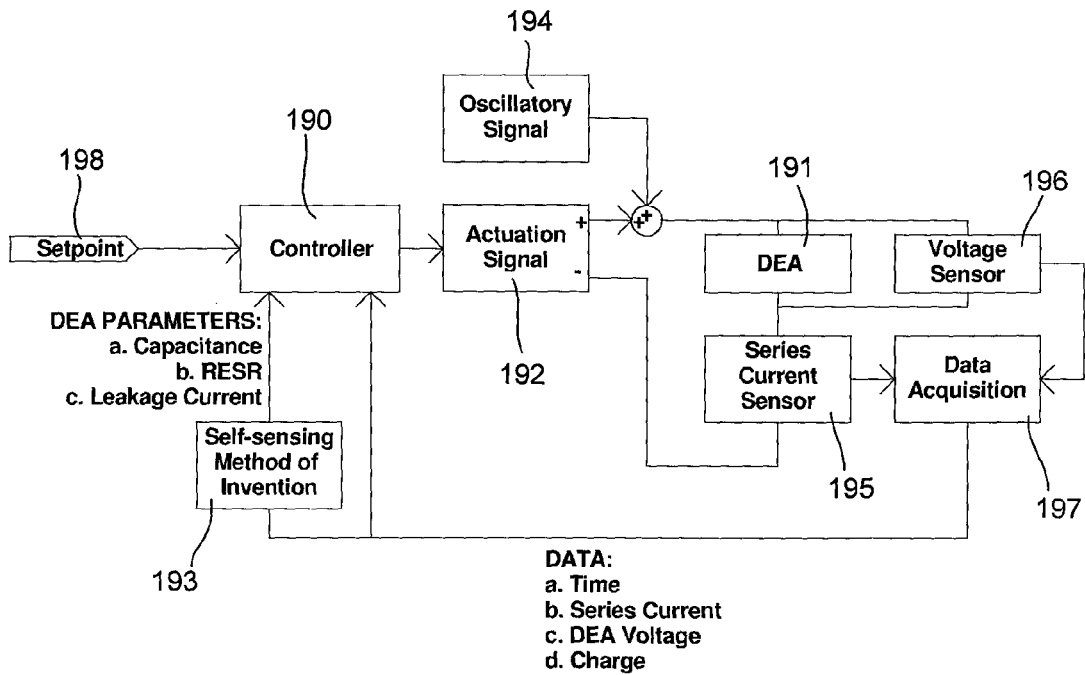
FIG. 19 is a schematic block diagram of an example system for implementing the self-sensing method of the present invention.

The present invention may therefore also be said to consist in a system adapted to perform self-sensing as described herein with respect to the method of the invention. An example of such a system adapted to perform the method of the first embodiment of the invention for closed-loop feedback control of a DEA is illustrated schematically in FIG. 19 by way of a non-limiting example.

The system preferably comprises a controller 190 which is adapted to control actuation of the DEA 191 (i.e. by controlling the actuation signal 192). The system also includes computing means or computing device 193 for implementing the self-sensing method of the present invention to derive estimates of one or more of the capacitance, equivalent series resistance, and leakage current of the DEA 191. To enable this, the system also includes an oscillatory voltage source or other means 194 for introducing a small-scale oscillatory signal to the actuation signal 192 supplied to the DEA, and measurement means or sensors, preferably in the form of the series current sensor 195 and voltage sensor 196. From the measurement means, the data acquisition means or unit 197 derives data representative of the potential difference across the DEA (or the capacitive component thereof, for the second embodiment of the method), series current through the DEA, and charge supplied to the DEA, with respect to time. These measurements are communicated to the computing means 193 for application of the method of the present invention to derive the DEA feedback parameters as described above.

Where the system is adapted to perform closed-loop feedback control of DEA actuation, the controller 190 is adapted to receive an indication of a required state of the DEA in the form of the setpoint 198. This may be communicated to the controller 190 from a human interface device, for example.

The method of the present invention would typically be implemented at least in part in a computer program to be executed by some form of programmable computing means or digital or mixed-signal computing device, generally an embedded computing device such as a microcontroller. Once programmed to perform particular functions pursuant to instructions from program software that implements the method of this invention, such digital computing means or systems in effect become special-purpose machines particular to the method of this invention. The techniques necessary for this are well-known to those skilled in the art of embedded computer systems.

Alternatively, the method of the present invention could potentially be performed at least in part by one or more application specific integrated circuits (ASIC).

It will also be appreciated that the functions of the controller 190, computing means 193, and data acquisition means 197 described above may be performed centrally by a single such computing device (e.g. microcontroller or ASIC), or alternatively distributed between a plurality of such devices.

The computing means 193 and/or data acquisition means 197 preferably includes a data storage means or memory device to store or record data required to perform the method of the invention. The data storage means may be volatile or non-volatile, and may be integrated within the computing means 193 in a single integrated circuit (IC), or may be a discrete IC component communicatively coupled with the computing means in the known way.

Computer programs implementing the method of this invention may be distributed to users on a distribution medium such as floppy disk, CD-ROM, USB flash memory, or other computer-readable medium. From there, they may be copied to an embedded solid-state memory or a similar intermediate storage medium of the computing means. When the programs are to be run, they will be loaded either from the intermediate storage medium into the execution memory of the computing means, configuring the computing means to act in accordance with the method of this invention. All these operations are well-known to those skilled in the art of embedded and/or computer systems.

The term "computer-readable medium" encompasses distribution media, intermediate storage media, execution memory of a computer, and any other medium or device capable of storing for later reading by a computer a computer program implementing the method of this invention.

The invention may thus also be said to consist in a computer program implementing the method of the invention, a computer-readable medium storing the computer program, and/or a system adapted to perform the method and/or execute the software of the invention.

As described above, the computing means is communicatively coupled with measurement means or measurement devices for measuring the electrical potential difference across the DE and the series current through the DE at specific points in time. From the series current measurements, the charge input to the DE can be derived.

Suitable measurement means/devices are known to those skilled in the art, and may include circuits comprising discrete or integrated resistors, capacitors, and operational amplifiers (op-amps) as unity gain buffer amplifiers, for example, arranged in the known way.

The data acquisition means 197 and/or computing means 193 preferably include at least one analog-to-digital converter (ADC) to convert the measurements into a digital format suitable for further processing by a digital computing means.

It is to be noted that where the term "measure" or "measured" is used herein, it is by no means a requirement that the particular parameter or characteristic must be measured directly. Rather, the parameter may be measured, derived, estimated, or approximated from other measurements without departing from the scope of the invention.

The term "instantaneous" in this specification refers to the general state of a component or integer of the invention at any particular point in time. However, it is not intended to exclude a measurement or approximation of that state which is derived from multiple measurements, as might be the case where the measurement is averaged or filtered over a short period of time (with respect to the mechanical or electrical time constant), for example. In fact, such averaging may be preferred to minimise the effects of noise or quantisation error. The term "instantaneous" depending on the context thus refers to any measurement, derivation or approximation which is at least indicative of the time-varying state of the component at or substantially adjacent a particular point in time.

From the foregoing it will be seen that the invention provides a method for dynamically estimating the DE state feedback parameters of equivalent series resistance of the electrodes, the capacitance of a DE, and the leakage current to through the dielectric membrane whether the DE is being actuated or being used to generate electrical energy, or being used solely as a sensor. This is achieved by self-sensing, meaning that no discrete strain, displacement, velocity, or acceleration sensors are required.

Although this invention has been described by way of example and with reference to possible embodiments thereof, it is to be understood that modifications or improvements may be made thereto without departing from the scope of the invention. The invention may also be said broadly to consist in the parts, elements and features referred to or indicated in the specification of the application, individually or collectively, in any or all combinations of two or more of said parts, elements or features. Furthermore, where reference has been made to specific components or integers of the invention having known equivalents, then such equivalents are herein incorporated as if individually set forth.

Unless the context clearly requires otherwise, throughout the description, the words "comprise", "comprising", and the like, are to be construed in an inclusive sense as opposed to an exclusive or exhaustive sense, that is to say, in the sense of "including, but not limited to".

Any discussion of the prior art throughout the specification should in no way be considered as an admission that such prior art is widely known or forms part of common general knowledge in the field.

The invention claimed is:

1. A method for estimating feedback parameters for the state of a dielectric elastomer (DE), comprising the steps of:
   introducing a small-scale oscillation to a voltage difference between electrodes of the DE;

measuring, over a period of time, potential difference across the DE and series current through the DE; and estimating one or more feedback parameters from coefficients of a plane of best fit through data derived from said measurements when defined as orthogonal axes.

2. The method of claim 1, wherein the feedback parameters comprises capacitance of the DE, and the capacitance is approximated by a first coefficient of the plane of best fit.

3. The method of claim 1, wherein the feedback parameters comprise leakage current through the DE, and the leakage current is estimated from a second coefficient of the plane of best fit.

4. The method of claim 1, wherein the step of estimating one or more feedback parameters from coefficients of the plane of best fit comprises performing regression analysis of the data derived from the measurements.

5. The method of claim 1, wherein the data derived from the measurements comprises potential difference across the DE, series current through the DE, charge supplied to the DE, and time, wherein the plane of best fit comprises a hyperplane.

6. The method of claim 5, wherein the feedback parameters comprise an equivalent series resistance of the DE, and the equivalent series resistance is estimated from a third coefficient of the plane of best fit.

7. The method of claim 6, wherein the equivalent series resistance is estimated by dividing the third coefficient of the plane of best fit by the capacitance of the DE.

8. The method of claim 3, wherein the leakage current is estimated from the second coefficient of the plane equation by subtracting the nominal combined effects of the rate of change of capacitance of the DE and the rate of change of equivalent series resistance of the DE from the second coefficient.

9. The method of claim 1, wherein the data derived from the measurements comprises the potential difference across the capacitive component of the DE and charge supplied to the DE over the period of time.

10. The method of claim 9, wherein the potential difference across the capacitive component of the DE is derived by subtracting a potential difference across an equivalent series resistance (ESR) of the DE from the potential difference across the DE.

11. The method of claim 10 wherein the ESR of the DE is estimated by the steps of:
supplying a Pulse Width Modulated (PWM) periodic actuation signal to the DE;
measuring the magnitude of a step change in voltage across the DE and the step change in current through the DE at the transition of the PWM actuation signal;
dividing the step change in voltage across the DE by the step change in current through the DE;
recording the time-history of the estimated ESR; and
deriving an approximation of ESR with respect to time from the recorded time-history of the estimated ESR, whereby the approximation is used to estimate the ESR between transitions of the PWM actuating signal.

12. The method of claim 3, wherein the leakage current is estimated from the second coefficient of the plane equation by subtracting the product of the rate of change of the capacitance of the DE and the potential difference across the capacitive component of the DE from the second coefficient.

13. The method of claim 5, wherein the charge supplied to the DE is derived by integrating the series current through the DE with respect to time.

14. The method of claim 1, wherein the DE comprises a dielectric elastomer actuator (DEA) and the method further comprises the step of controlling actuation of the DEA based upon the feedback parameters, thereby forming a closed-loop feedback control system.

15. The method of claim 14, further comprising the steps of:
receiving an input signal indicative of a required state of the DEA; and
adjusting one or more system inputs in response to both the input signal and the state of the DEA such that the state substantially matches the required state.

16. A dielectric elastomer (DE) system comprising:
a DE comprising a pair of electrodes separated by an elastomer membrane;
a power supply adapted to provide a small-scale voltage oscillation to the DE;
sensors for measuring the potential difference across the DE and series current through the DE; and
a computing device communicatively coupled to the sensors, the computing device being adapted, over a predetermined period of time, to estimate one or more feedback parameters from coefficients of a plane of best fit through data derived from said measurements when defined as orthogonal axes.

17. The system of claim 16, wherein the sensors have a sampling frequency higher than a frequency of the predetermined period of time.

18. The system of claim 16, wherein the computing device is further adapted to receive an input signal indicative of the required state of the DE, and to control one or more system inputs to provide closed-loop feedback control of the DE based upon the feedback parameters.

19. The system of claim 16, wherein the computing device is adapted to perform regression analysis to estimate the coefficients.

20. The system of claim 16, wherein the feedback parameters comprise one or more of the capacitance, equivalent series resistance and/or leakage current of the DE.

* * * * *